(12) United States Patent
Demura et al.

(10) Patent No.: US 7,965,462 B2
(45) Date of Patent: Jun. 21, 2011

(54) STORING PARTIAL DATA SETS TO MAGNETIC TAPE

(75) Inventors: Masayuki Demura, Kanagawa (JP); Glen A. Jaquette, Tucson, AZ (US); Hisato Matsuo, Kanagawa (JP); Keisuke Tanaka, Machida (JP)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 12/351,725

(22) Filed: Jan. 9, 2009

(65) Prior Publication Data

US 2010/0177421 A1 Jul. 15, 2010

(51) Int. Cl.
*G11B 20/16* (2006.01)

(52) U.S. Cl. ............... 360/40; 360/48; 360/53
(58) Field of Classification Search ............ None
See application file for complete search history.

(56) References Cited

U.S. PATENT DOCUMENTS

| | | | |
|---|---|---|---|
| 6,833,970 B2 * | 12/2004 | Buckingham | 360/48 |
| 6,856,479 B2 | 2/2005 | Jaquette et al. | |
| 6,958,873 B2 * | 10/2005 | Sved | 360/53 |
| 6,970,311 B2 | 11/2005 | Jaquette | |
| 7,119,974 B2 | 10/2006 | Jaquette | |
| 2003/0030932 A1 | 2/2003 | Sved | |
| 2004/0230741 A1 | 11/2004 | Watanabe | |
| 2005/0041317 A1 | 2/2005 | Jaquette | |
| 2005/0172206 A1 | 8/2005 | Hana et al. | |
| 2006/0002002 A1 | 1/2006 | Jaquette | |

FOREIGN PATENT DOCUMENTS

EP 0913826 5/1999

* cited by examiner

*Primary Examiner* — Jason C Olson
(74) *Attorney, Agent, or Firm* — Dan Shifrin

(57) ABSTRACT

Methods, logic, apparatus and computer program product write data, comprising less than a full Data Set, to magnetic tape. Data is received from a host, a do-not-interleave command is issued and C1 and C2 ECC are computed. Codeword Quad (CQ) sets are then formed. At least one CQ set of the Data Set is written to a magnetic tape in a non-interleaved manner and a Data Set Information Table (DSIT) is written to the magnetic tape immediately following the at least one written CQ set. An address transformation may be used to cancel interleaving. Writing a CQ set may include writing a plurality of contiguous instances of the CQ set to the magnetic tape to maintain the effectiveness of ECC capability.

25 Claims, 18 Drawing Sheets

Data Set and Interleaving Map

SDS = Sub Data Set
DSIT = Data Set Information Table

STORING PARTIAL DATA SETS TO MAGNETIC TAPE

RELATED APPLICATION DATA

The present application is related to commonly-assigned and co-pending U.S. application Ser. No. 12/351,713, entitled RECORDING MULTIPLE CODEWORD SETS DURING LATENCY PERIOD, filed on the filing date hereof, which application is incorporated herein by reference in its entirety.

TECHNICAL FIELD

The present invention relates generally to recording data on a magnetic tape media and, in particular, to recording codeword quads representing less than a full Data Set.

BACKGROUND ART

The smallest unit written to magnetic tape media is the Data Set. If the size of data being written in a transaction is smaller than the size of a Data Set, performance is adversely affected because the space of a full Data Set is still allocated. Moreover, writing fewer codeword quads (CQs) than a full Data Set precludes interleaving because the CQs can't be spaced as far apart as when a full Data Set is written. Consequently, the ability of ECC to correct errors is reduced.

SUMMARY OF THE INVENTION

The present invention provides a method for writing data to magnetic tape, wherein the data comprises less than a full Data Set. The method comprises receiving data from a host, issuing a do-not-interleave command, computing C1 and C2 ECC and forming CQ sets. The method further comprises writing at least one CQ set of the Data Set to a magnetic tape in a non-interleaved manner and writing a Data Set Information Table (DSIT) to the magnetic tape immediately following the at least one written CQ set. The present invention further includes recording system logic, a computer program product and a method for deploying computing infrastructure for writing data to a magnetic tape. The present invention also includes a tape drive for writing data to magnetic tape.

In one embodiment, an address transformation for the Sub Data Sets is executed in response to the do-not-interleave command.

In another embodiment, writing a CQ set includes writing a plurality of contiguous instances of the CQ set to the magnetic tape to maintain the effectiveness of ECC capability.

DETAILED DESCRIPTION OF THE PREFERRED EMBODIMENT

Figure 1:
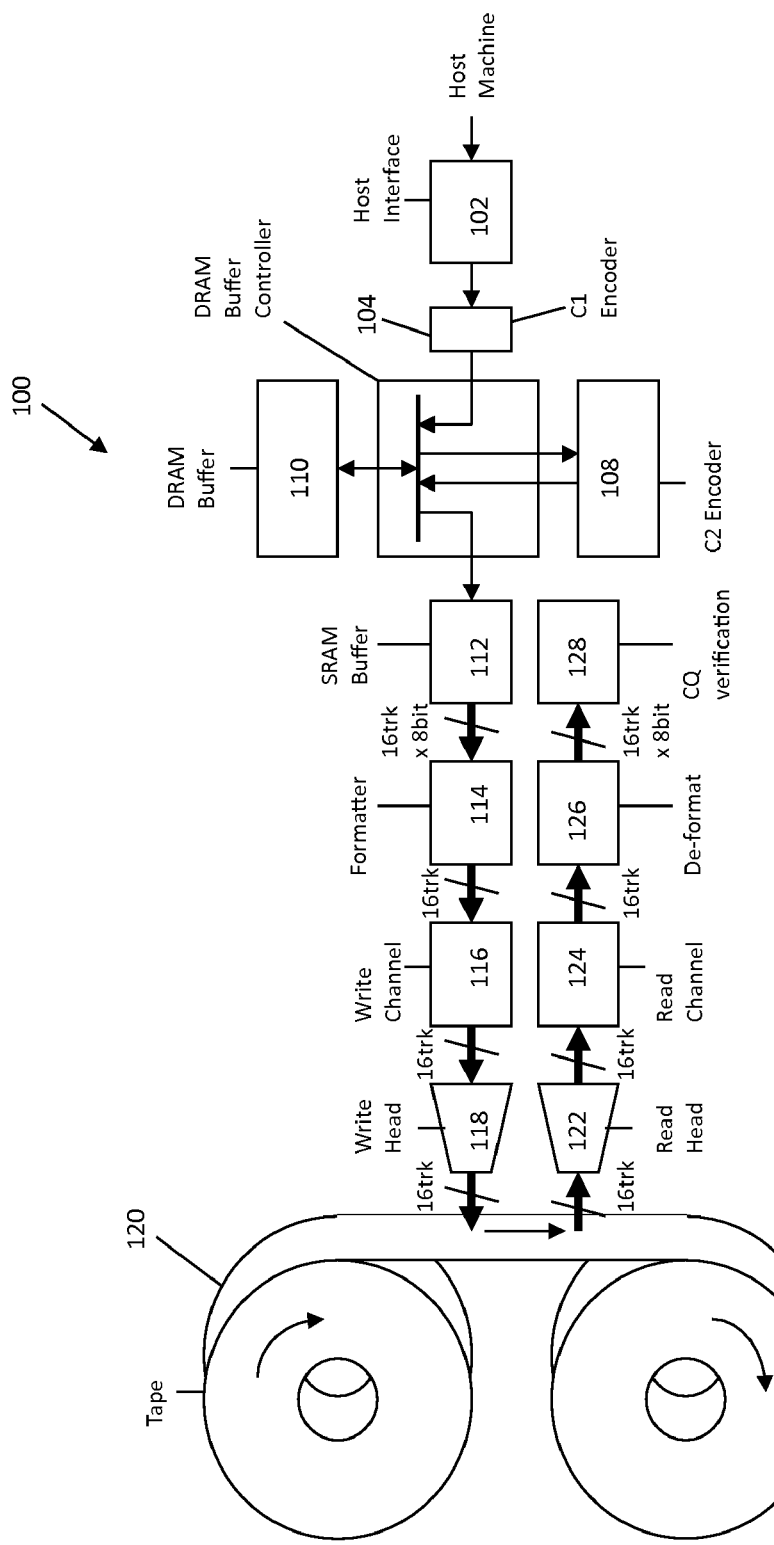
FIG. 1 is a block diagram of a magnetic tape drive with which the present invention may be implemented.

Components described in this specification may be implemented as a hardware circuit comprising custom VLSI circuits or gate arrays, off-the-shelf semiconductors such as logic chips, transistors, or other discrete components. A component may also be implemented in programmable hardware devices such as field programmable gate arrays, programmable array logic, programmable logic devices or the like. Components may also be implemented in software for execution by various types of processors. An identified component of executable code may, for instance, comprise one or more physical or logical blocks of computer instructions which may, for instance, be organized as an object, procedure, or function. Nevertheless, the executables of an identified component need not be physically located together, but may comprise disparate instructions stored in different locations which, when joined logically together, comprise the component and achieve the stated purpose for the component.

Furthermore, the described features, structures, or characteristics of the invention may be combined in any suitable manner in one or more embodiments. In the following description, numerous specific details are provided, such as examples of programming, software components, user selections, network transactions, hardware components, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known components structures, materials, or operations are not shown or described in detail to avoid obscuring aspects of the invention.

The schematic flow chart diagrams described herein are generally set forth as logical flow chart diagrams. As such, the depicted order and labeled steps are indicative of one embodiment of the presented process. Other steps and processes may be conceived that are equivalent in function, logic, or effect to one or more steps, or portions thereof, of the illustrated process. Additionally, the format and symbols employed are provided to explain the logical steps of the process and are understood not to limit the scope of the process. Indeed, the arrows or other connectors are generally used to indicate only the logical flow of the process. Additionally, the order in which a particular process occurs may or may not strictly adhere to the order of the corresponding steps shown in a flowchart.

Magnetic tape provides a means for physically storing data which may be archived or which may be stored in storage shelves of automated data storage libraries and accessed when required. Data stored in this manner has an aspect of permanence which allows copies of the data stored in memory or disk at a host system to be erased, knowing that a copy exists on magnetic tape. The available storage space at the host system is relatively expensive, and there is a desire to release the storage space as soon as possible. Hence, data is typically transferred through an intermediate staging buffer, such as a hard disk, to the tape drive, and there is also a desire to release and overwrite the staging buffer as soon as possible. Thus, it is often desirable to "synchronize" the data.

FIG. 1 is a high level block diagram of a data tape drive 100 in which the present invention may be incorporated. Data to be recorded is transmitted from a host (not shown) to the drive 100 through a host interface 102. The data undergoes a first encoding in a C1 encoder 104 and passed to a DRAM buffer controller 106. The C1-encoded data undergoes a second encoding in a C2 encoder 108 and is stored in a DRAM buffer 110. The data is subsequently stored in an SRAM buffer 112 and formatted in a formatter 114. Formatted data is sent to a write channel and then to a write head 118 which records the data onto the tape 120.

When the data is read back from the tape 120, a read head 122 detects the data and passes it to a read channel. The data is then processed in a de-formatter 126 and codeword quads are verified in a verifier 128. The data is then decoded and sent to the requesting host.

"Synchronized data" is defined as data or other information which is subject to a "synchronizing event" or similar command requiring the tape drive to not return "Command Complete" to a write type of command, or an indication that the command has been or will be successfully executed, until it has actually committed the data to media, specifically, the magnetic tape. As the result, if power is lost, the data can be recovered from the tape, whereas it may not be recoverable from a volatile DRAM storage of the tape drive buffer.

One example of a synchronizing event is a Write Filemark command with the Immediate bit set to "0". This means that the drive is not to respond immediately, but instead is to respond when the command has completed; that is, that any data sent as part of the command is written out to tape. A specialized case of a Write Filemark command occurs when the number of Filemarks field is also set to "0", meaning that the Write Filemark command has no data of its own, and all data which precedes the command must be written to tape before a command complete is sent. Hence, this command is often referred to as a "Synchronize" command, as is known to those of skill in the art.

Another example of a synchronizing event is a host selectable write mode known to those of skill in the art as "non-buffered writes", where an implicit synchronize must be performed after each record is written from the host. "Command Complete" is not returned for any write command until the data is successfully written on media.

Herein, writing any data record, group of records, or other mark is referred to as a "transaction" and writing such data record, etc. as the result of a synchronizing event is referred to as a "synchronized transaction".

Figure 2:
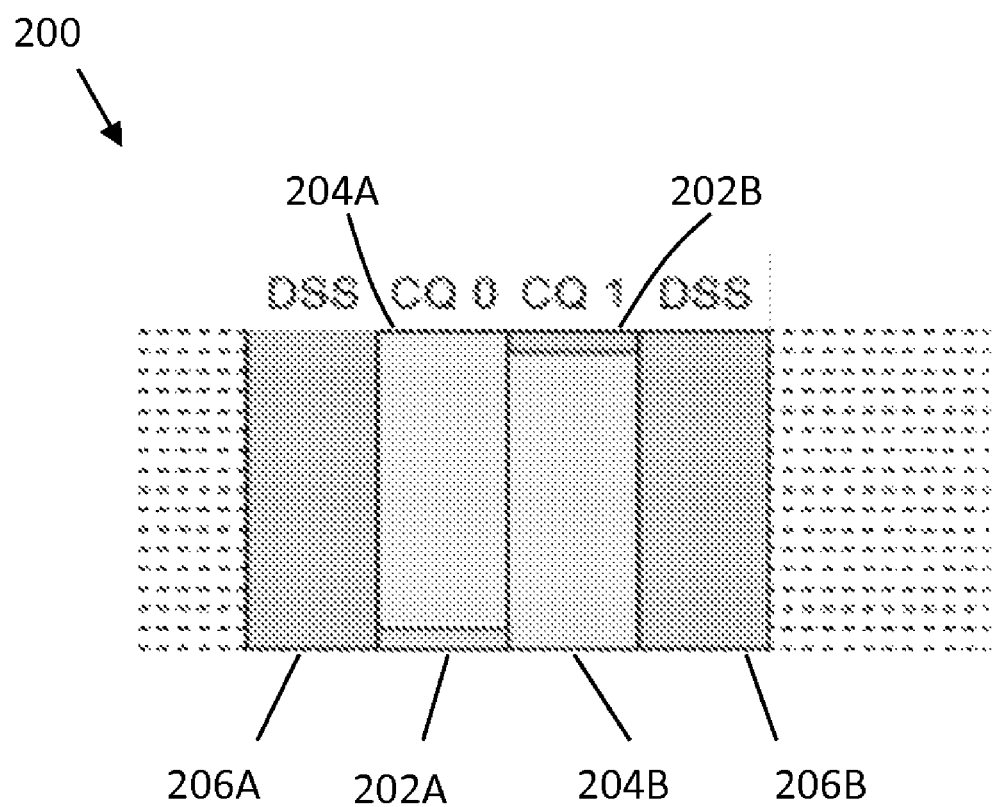
FIG. 2 illustrates an idealized example of a recording format for a short record of two CQ Sets and beginning and ending DSS patterns.
Figure 3:
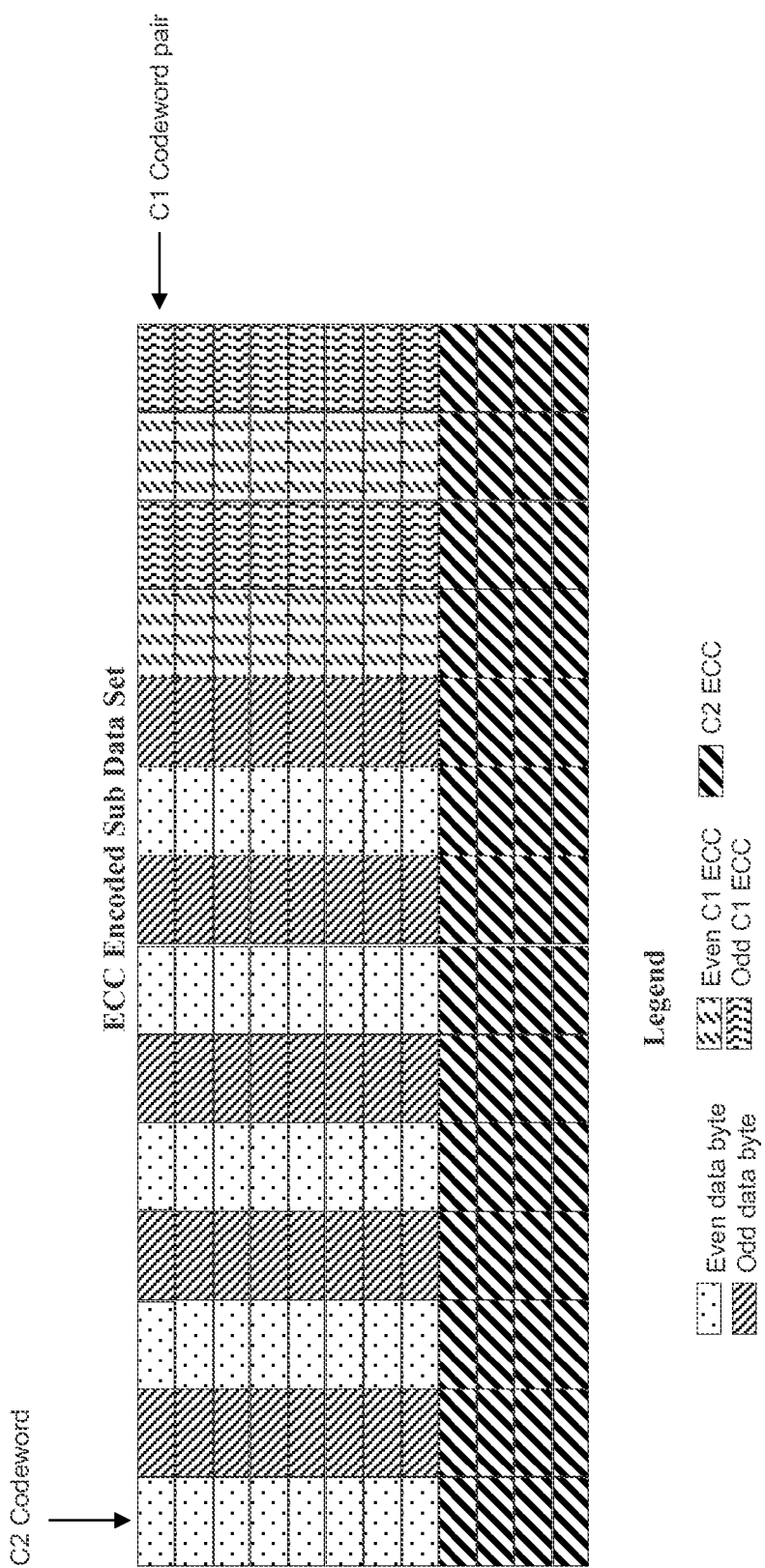
FIG. 3 illustrates an ECC encoded Sub Data Set.

In conventional recording of data to tape media, the smallest unit written to tape is the Data Set. FIG. 2 illustrates an idealized example of the format for writing a Data Set 200 onto a portion of tape. One Codeword Quad (CQ) 202A, 202B is indicated within each CQ Set 204A, 204B by a small rectangle and beginning and closing DSSs 206A, 206B bracket the record 200. A Data Set contains two types of data: user data and administrative information about the Data Set, the latter being in the Data Set Information Table (DSIT). All data is protected by an error correction code (ECC) to minimize data loss due to errors or defects. The Data Set comprises a number of Sub Data Sets, each containing data arranged in rows. A Sub Data Set row may contain user data or contain the DSIT. As illustrated in FIG. 3, each row consists of two interleaved byte sequences. A first level ECC (C1 ECC) is computed separately for the even bytes and for the odd bytes for each row. The resulting C1 ECC even and odd parity bytes are appended to the corresponding row, also in an interleaved fashion. The ECC protected row is the Codeword Pair (CWP). The even bytes form the even C1 Codeword while the odd bytes form the odd C1 Codeword. A second level ECC (C2 ECC) is computed for each column and the resulting C2 ECC parity bytes are appended to the corresponding columns. The ECC protected column is a C2 Codeword.

The Sub Data Set, when so protected by C1 and C2 ECC, is the smallest ECC-protected unit written to tape. Each Sub Data Set is independent with respect to ECC; that is, errors in a Sub Data Set affect only that Sub Data Set. The power of any ECC algorithm depends upon the number of parity bytes and is stated in terms of its correction capability. For a given number of C1 ECC parity bytes computed for a C1 codeword, up to K1 errors may be corrected in that codeword. And, for a given number of C2 ECC parity bytes computed for a C2 codeword, up to K2 errors may be corrected in that C2 Codeword.

It will be appreciated that multiple errors in the same Sub Data Set can overwhelm the ability of the C1 or the C2 correction power to the extent that an error occurs when the data is read. Errors may be caused by very small events such as small particles or small media defects. Errors may also be caused by larger events such as scratches, tracking errors or mechanical causes.

To mitigate the possibility that a single large error will affect multiple Codewords in a single Sub Data Set, some methods of writing place Codewords from each Sub Data Set as far apart as possible along and across the tape surface. A single error would therefore have to affect multiple Codewords from the same Sub Data Set before the ECC correction capability is overwhelmed. Spatial separation of Codewords from the same Sub Data Set reduces the risk and is accomplished in the following manner for a multi-track recording format. For each track of a set of tracks being recorded simultaneously, a Codeword Quad (CQ) is formed by combining a Codeword Pair from one Sub Data Set with a Codeword Pair from a different Sub Data Set. The resulting CQ is written on one of the multiple recorded tracks. In like manner, CQs are formed for all remaining tracks by combining Codeword Pairs, all Codeword Pairs being from differing Sub Data Sets. The group of CQs written simultaneously is called a CQ Set.

Figure 4:
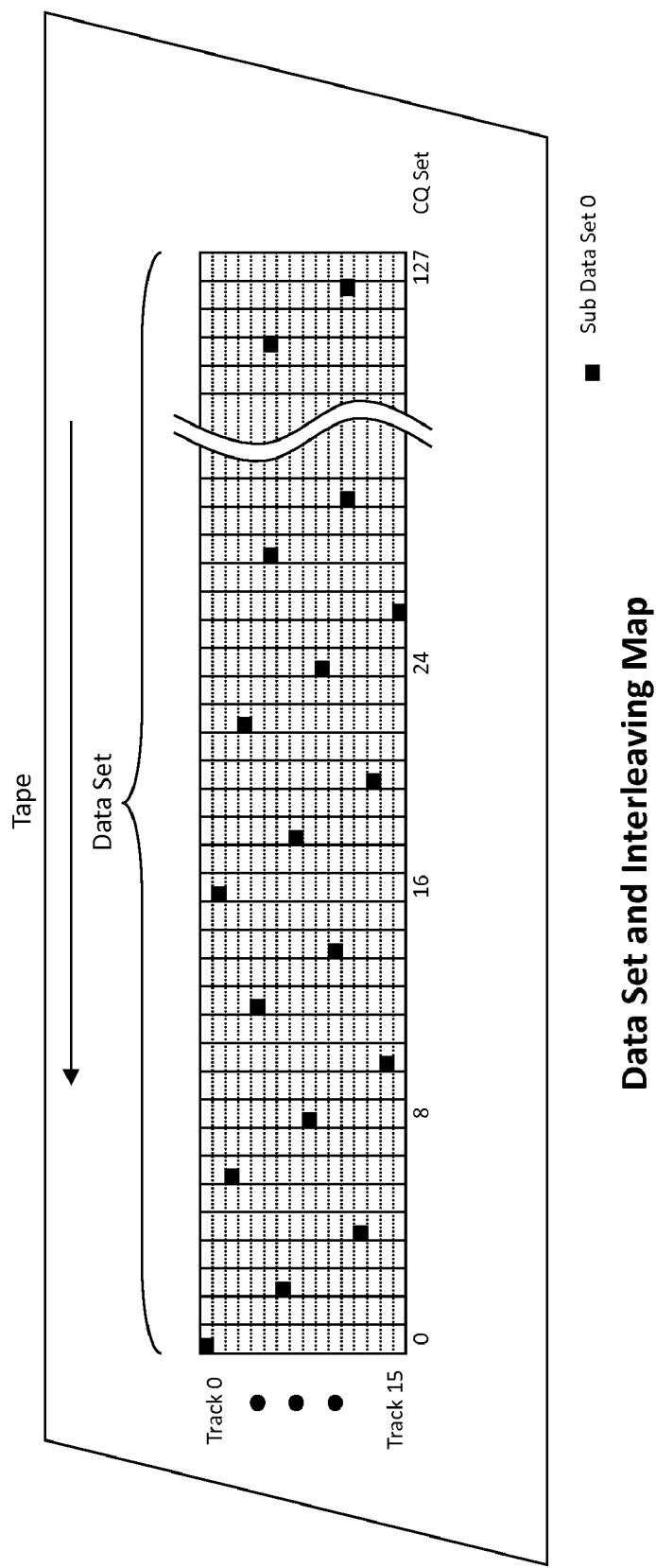
FIG. 4 illustrates a Data Set interleaving map.
Figure 5:
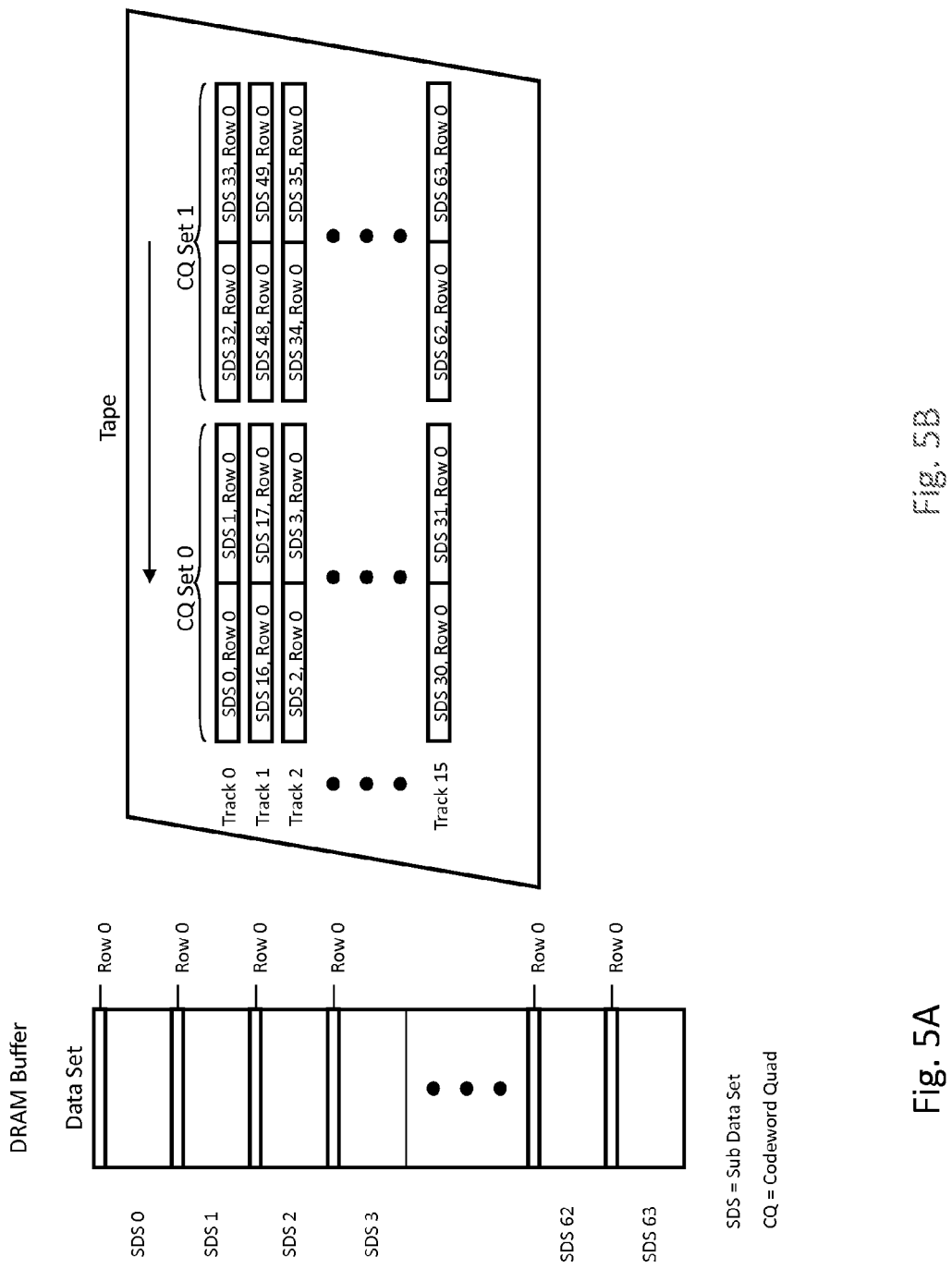
FIGS. 5A and 5B illustrate the arrangement of Sub Data Sets in a Data Set and on tape.

For example, in a 16-track recording format, there are 16 CQs in a CQ Set, comprising 32 Codeword Pairs. If there are 64 Sub Data Sets in a Data Set, two CQ Sets could be recorded before it were necessary to record a second Codeword Pair from a given Sub Data Set. FIG. 4 illustrates a Data Set as recorded on tape. The shaded cells indicate the location of the Sub Data Sets 0, longitudinally separated along a track transversely separated across tracks. As will be appreciated, a large defect would have to span multiple shaded cells in order to overwhelm the ECC in any one Sub Data Set. FIGS. 5A and 5B illustrate the format of Sub Data Sets stored in the DRAM buffer (FIG. 5A) and the format of the CQ sets of the Sub Data Sets as recorded onto the tape (FIG. 5B).

A difficulty with respect to magnetic tape is that the data is recorded sequentially without long gaps between Data Sets, whereas synchronized transactions are stored in separate bursts for each synchronizing event, with a noticeable time period before writing the next transaction. This requires that the tape drive "backhitch" after writing the synchronized transaction in order to write the next transaction closely following the preceding transaction. Tape is written or read while it is moved longitudinally at a constant speed. Hence, a backhitch requires that the tape be stopped, reversed to beyond the end of the previous transaction, stopped again, and accelerated up to speed in the original direction by the time that the end of the previous transaction is reached. As is understood by those of skill in the art, the backhitch process consumes a considerable amount of time and, if a large number of small synchronized transactions are to be stored, the throughput of the tape drive is reduced dramatically. As an example, backhitch times can vary from about half a second to over three seconds.

Figure 6:
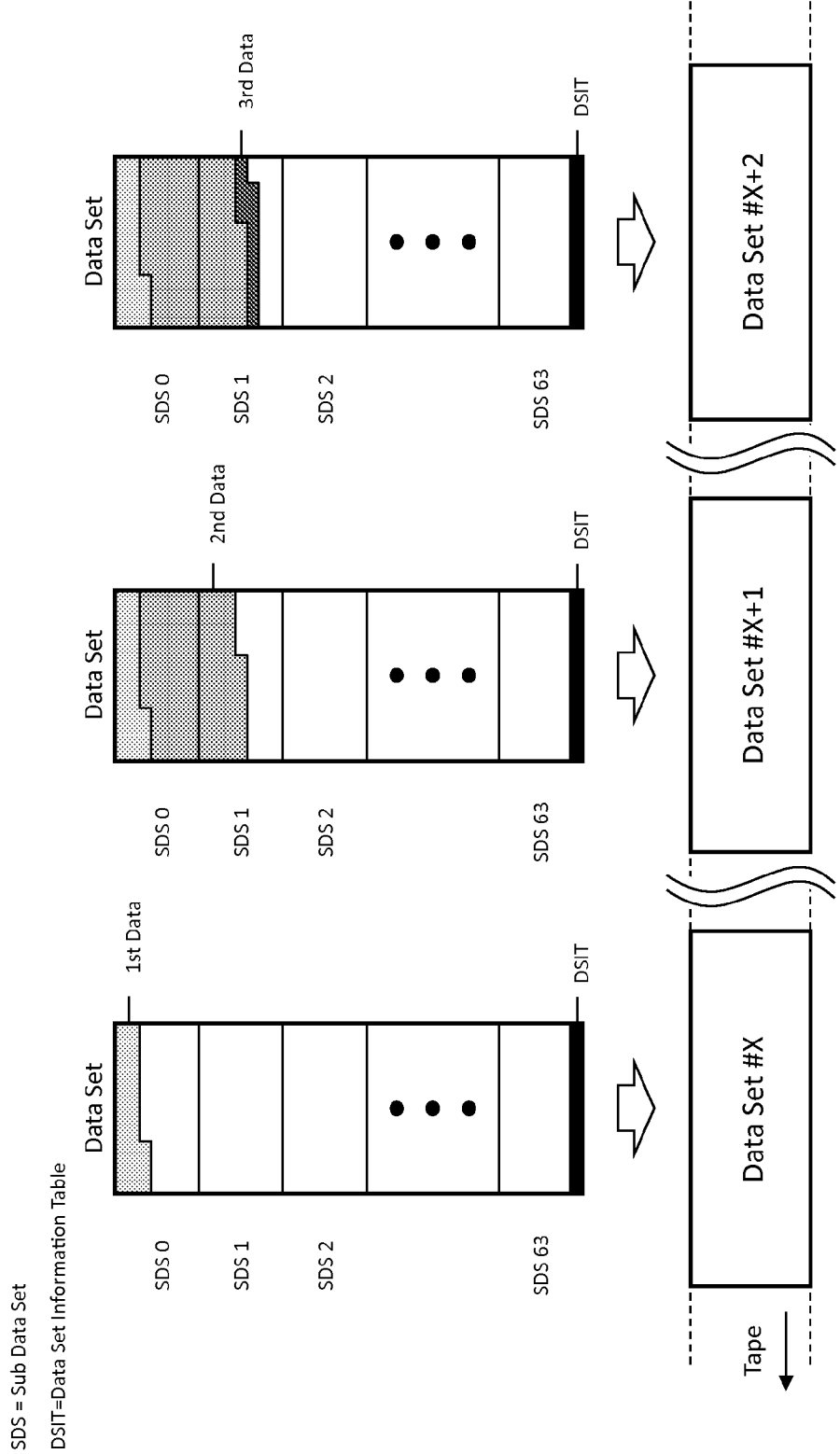
FIG. 6 illustrates a prior art manner in which an entire Data Set is written to tape using RABF.

Commonly-assigned U.S. Pat. No. 6,856,479 discloses a solution to the problem by writing synchronized data transactions to magnetic tape without stopping the tape, perhaps leaving gaps between the transactions, accumulates the synchronized transactions in a buffer, and subsequently rewrites the accumulated transactions from the buffer to the magnetic tape in a sequence as illustrated in FIG. 6. This is now called "Recursive Accumulating Backhitchless Flush", or "RABF", in the art. With large sized transactions relative to buffer size, it is possible that the buffer will fill with the accumulated transactions relatively quickly, forcing the recursive writing of the transactions and holding off the receipt of additional data during the recursive writing, such that non-RABF performance will approach that of RABF recording.

Figure 7:
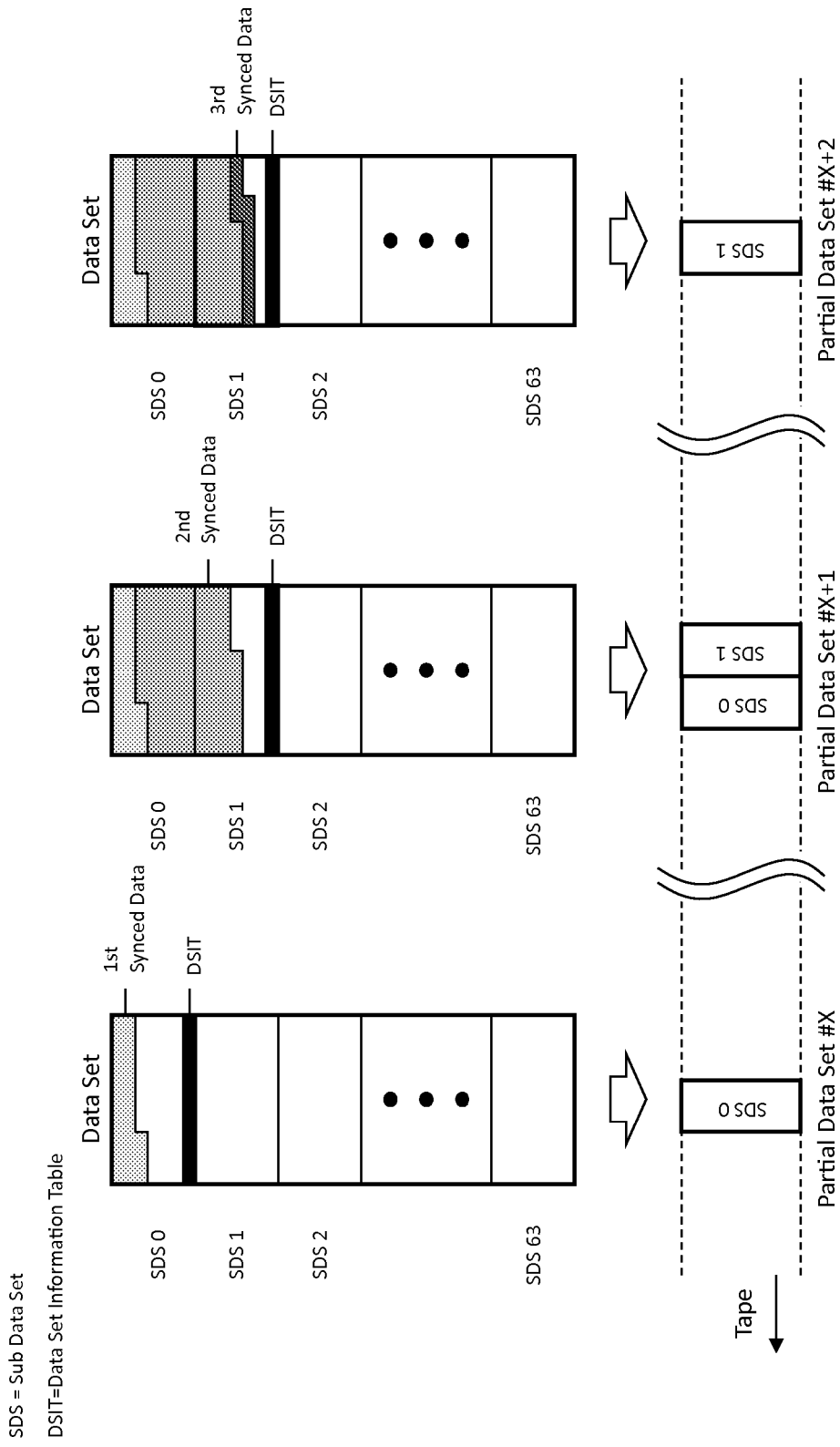
FIG. 7 illustrates a manner in which an entire Data Set is written to tape without interleaving using RABF in accordance with the present invention.

As noted above, heretofore if the size of data being written in a transaction is smaller than the size of a Data Set, recording is inefficient and the effectiveness of the ECC is reduced. FIG. 7 illustrates partial Data Set recording in accordance with the present invention whereby performance, efficiency and ECC effectiveness are maintained.

Figure 8:
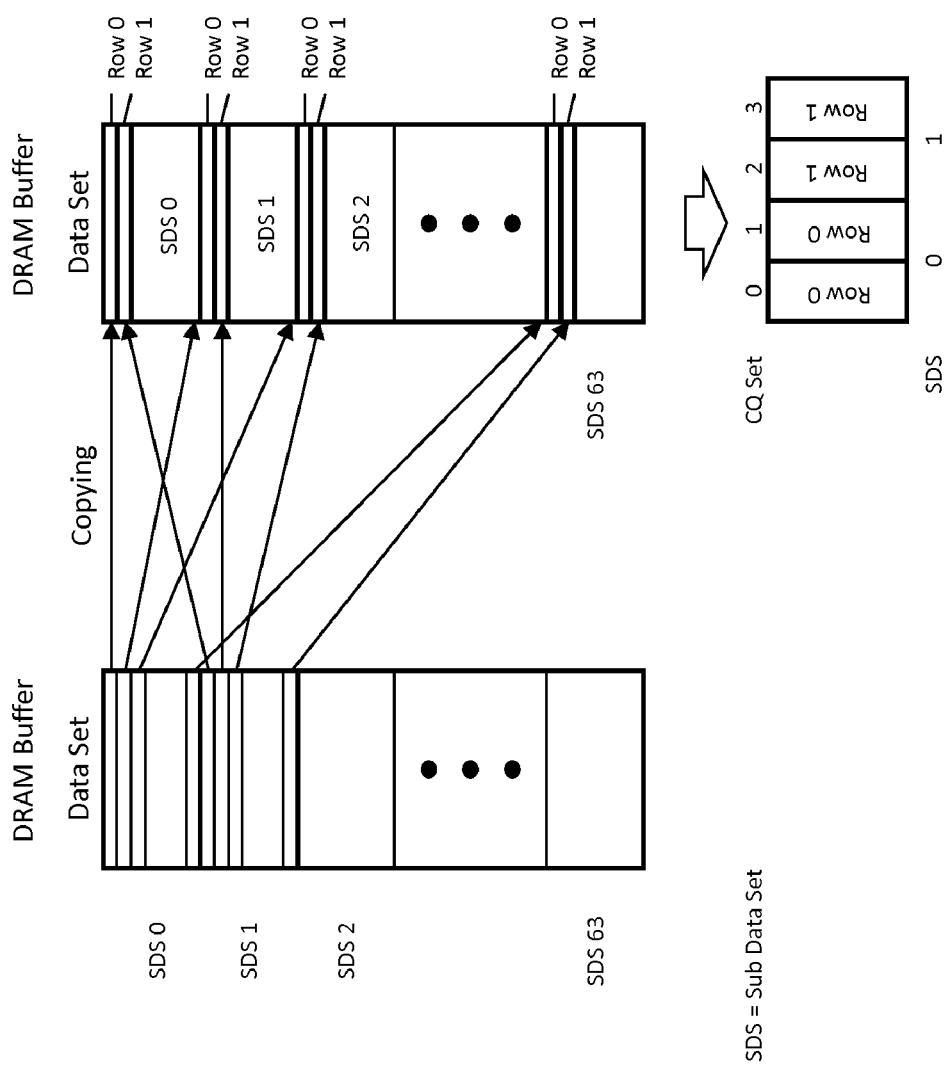
FIG. 8 illustrates a method to cancel interleaving by copying a Data Set from one portion of the DRAM buffer to another.

Because interleaving relies on a significant amount of space between related CQs, when partial Data Set recording is employed the present invention invokes a do-not-interleave command to cancel the interleaving operation. One process which may be used to cancel interleaving, illustrated in FIG. 8, is to copy Sub Data Sets from one area of the buffer to another whereby the Rth row of the Nth Sub Data Set is copied to the Nth row of the Rth Sub Data Set. The resulting partial Data Set is then written to tape without interleaving such that Sub Data Set 0 is written at CQ Sets 0 and 1. However, copying requires significant processor time.

Figure 9:
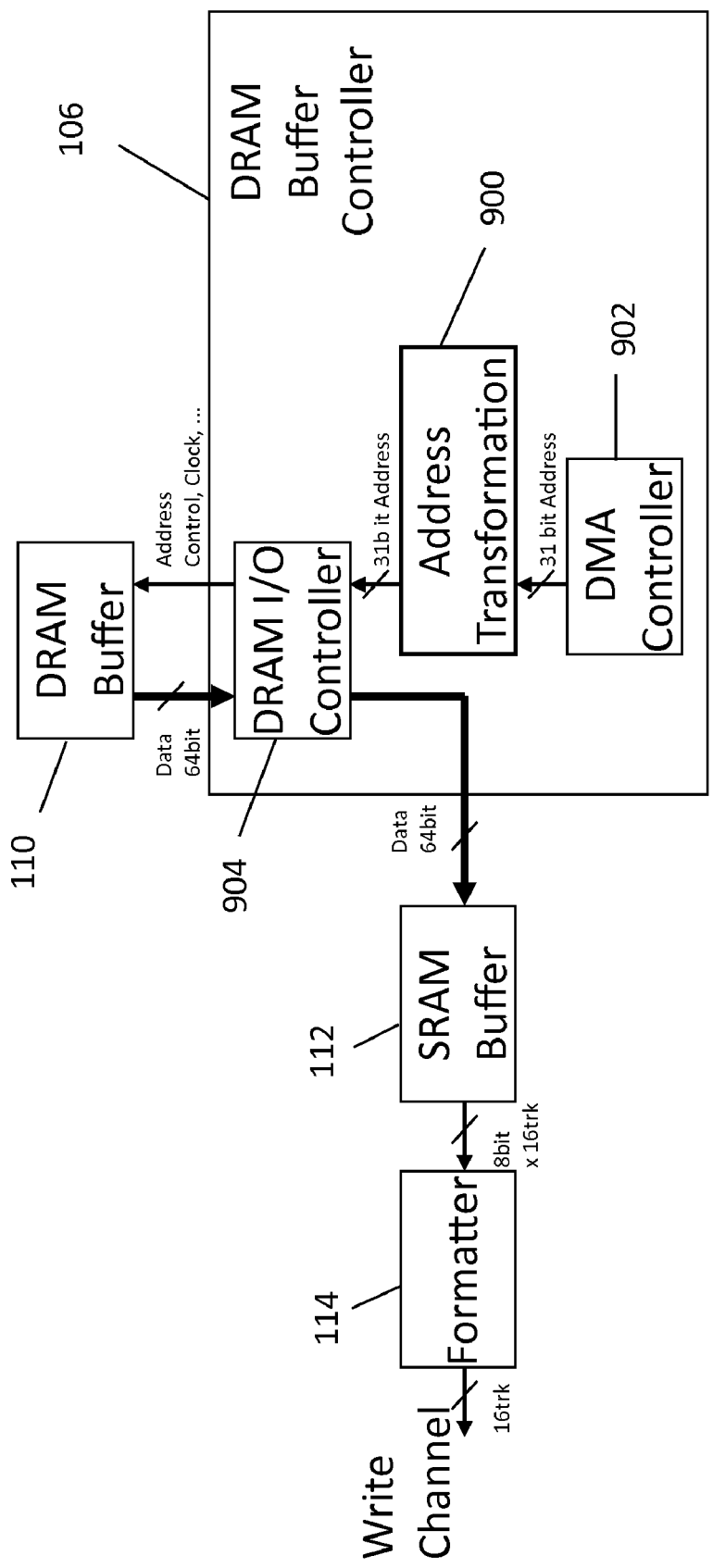
FIG. 9 is a block diagram of the DRAM buffer with address transformation logic to cancel interleaving.
Figure 10A:
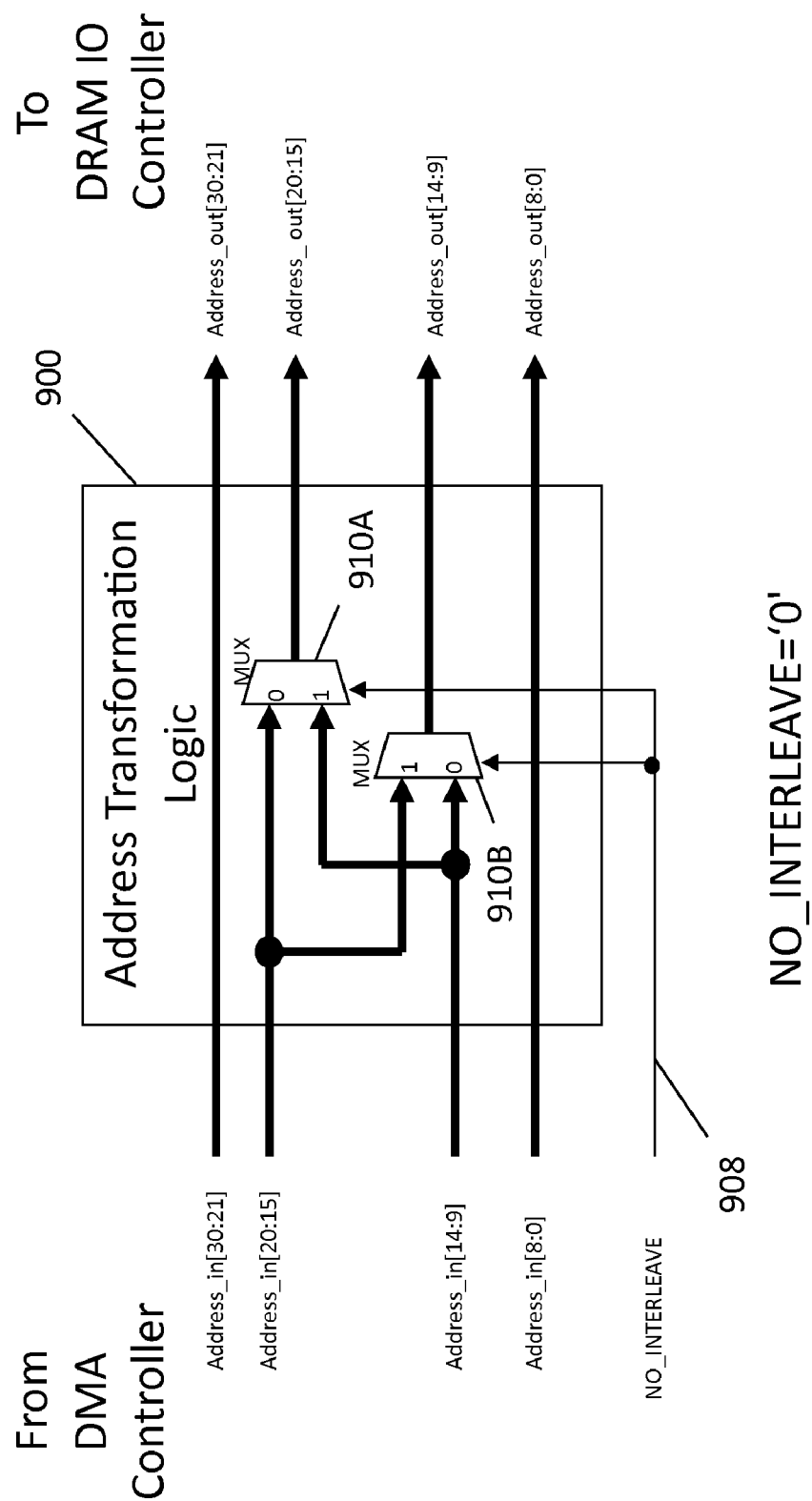
FIG. 10A illustrates the address transformation logic in a normal, no transformation, operating mode.
Figure 10B:
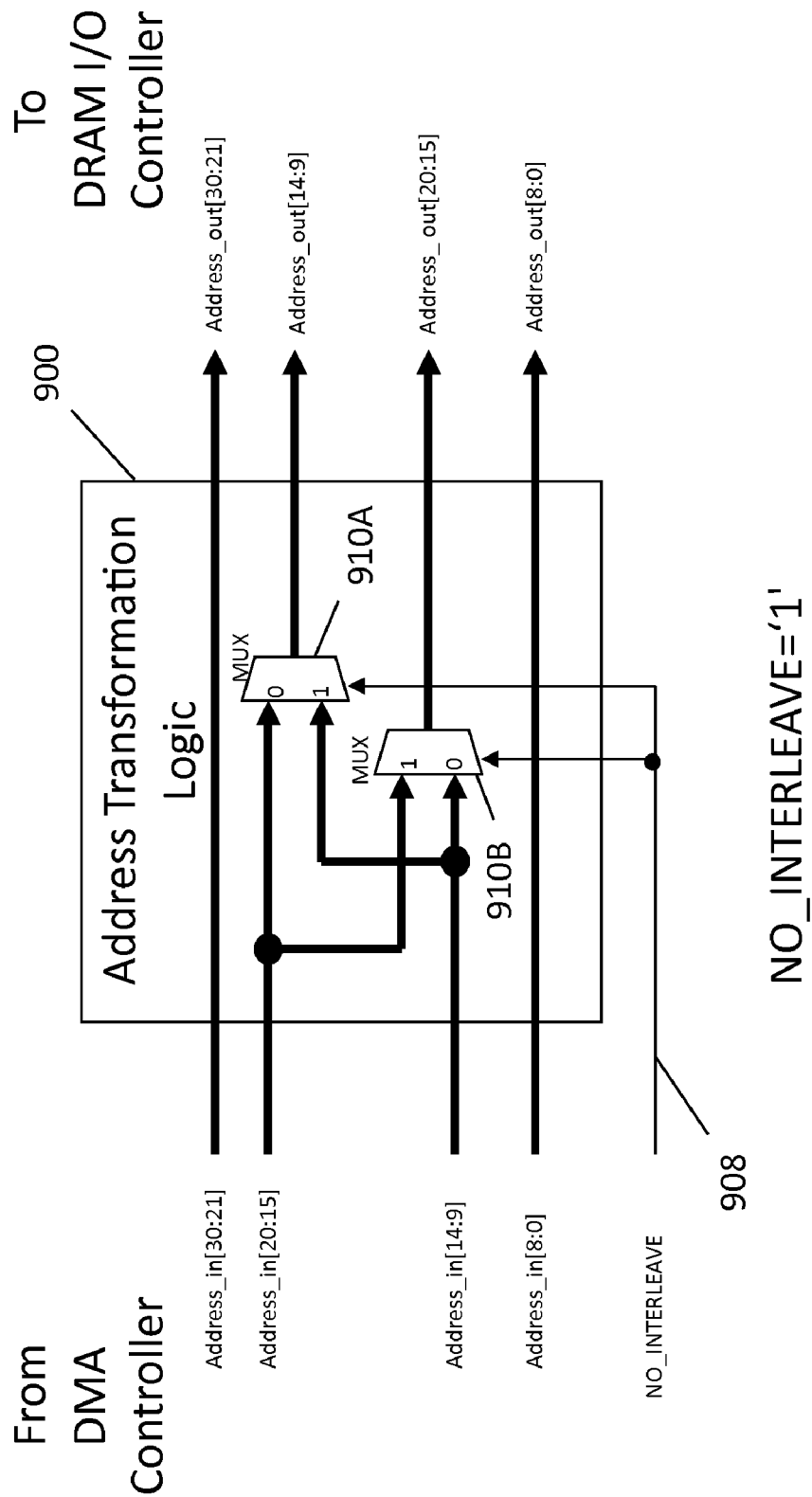
FIG. 10B illustrates the address transformation logic in a do-not-interleave, transformation, mode.
Figure 11:
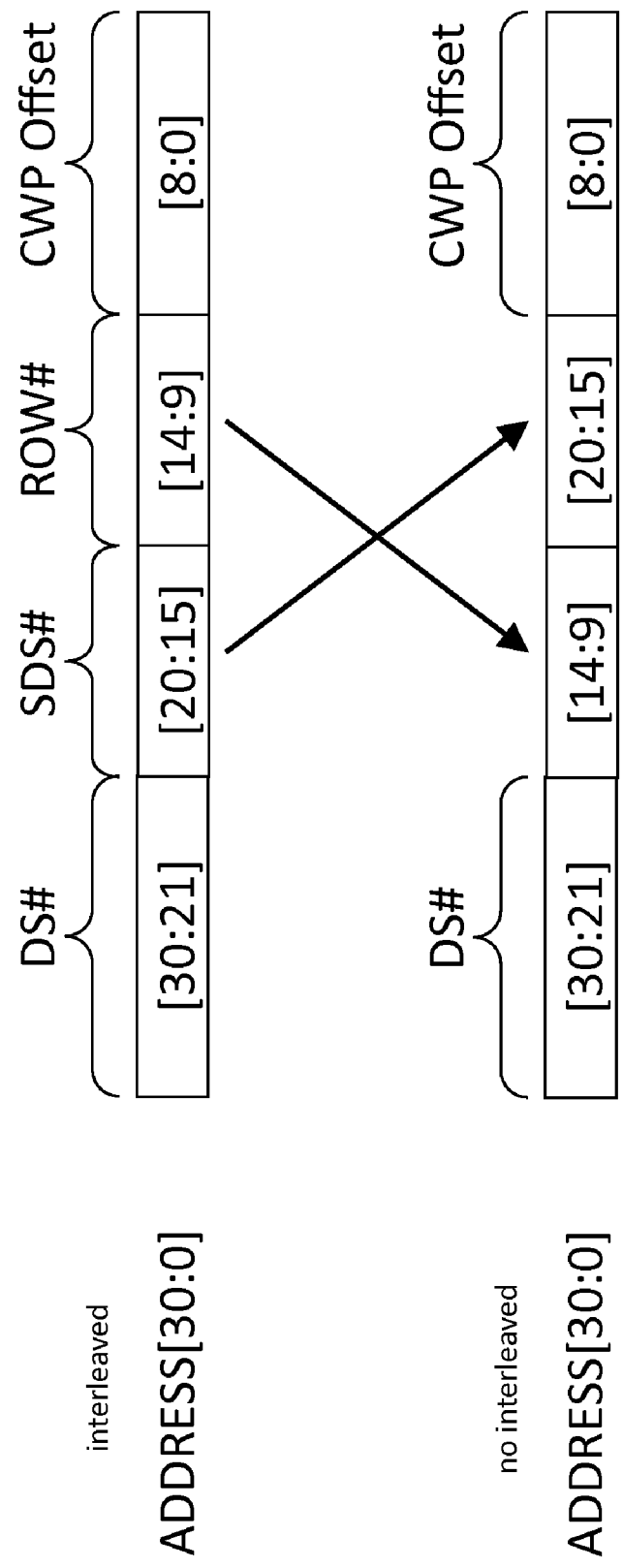
FIG. 11 illustrates a data set undergoing address transformation.

Interleaving may also be cancelled through an address transformation which may be completed within a single clock cycle and therefore requires far less processor time than copying. The DMA controller is typically used to, among other functions, generate addresses in order to build CQ sets into the SRAM buffer. When address transformation is invoked to cancel interleaving, logic transforms the address of the Rth row of the Nth Sub Data Set into the address of the Nth row of the Rth Sub Data Set. The resulting partial Data Set is then written to tape without interleaving. FIG. 9 is a block diagram of the DRAM buffer controller 106, including address transformation logic 900 which, in response to the DMA controller 902, performs the address transformation. FIG. 10A is a logic diagram of the address transformation logic 900 during normal, interleaving operation. The NO_INTERLEAVE line 908 is disabled and two multiplexers 910A, 910B pass their respective primary inputs from the DMA controller 902 to the DRAM I/O controller 904. When interleaving is to be disabled, as illustrated in FIG. 10B, the DMA controller 902 issues a do-not-interleave command and the NO_INTERLEAVE line is enabled. In response, the two multiplexers 910A, 910B pass their respective secondary inputs from the DMA controller to the DRAM I/O controller 904, thus transforming the input address of the Rth row of the Nth Sub Data Set into the address of the Nth row of the Rth Sub Data Set. FIG. 11 illustrates a data set following the address transformation.

In order to at least partially compensate for the reduced effectiveness of ECC when interleaving is cancelled, the present invention may optionally cause each CQ set to be written to the tape multiple times. As previously described, the data content is placed into Sub Data Sets and the Codeword Pairs of the Sub Data Sets are then allocated to CQ Sets as previously described with respect to FIG. 2. When written to tape, the CQ Sets within a group, such as a record or Data Set, are delimited by a special, easily recognized pattern known as the Data Set Separator (DSS) pattern (see FIG. 2).

Figure 12:
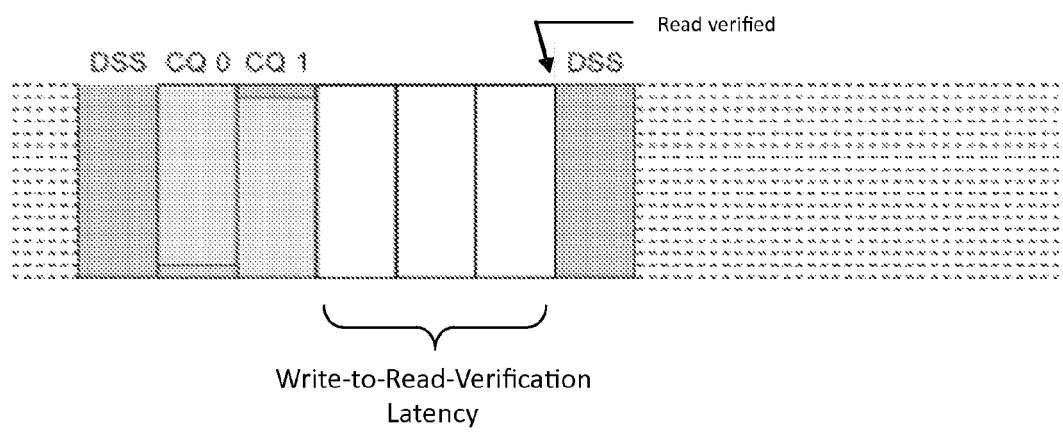
FIG. 12 illustrates a more realistic example of a recording format for a short record in which the latency before recording the closing DSS is shown.

However, the idealized example of formatting of FIG. 2 is not used in practice. Modern data storage devices verify data shortly after it is written. If an error is detected, the data is rewritten. In a tape, the read head element typically follows the write head element by some distance. Thus, a written CQ Set may require some time before it passes beneath the read head element. This introduces a minimum time between writing and the ability to verify the written data. This time may also be increased by the processing time required for the tape drive to perform error detection. And, if the data needs to be rewritten, additional time may be required to prepare for the rewrite operation. The total time corresponding to the distance along the tape between the point at which a CQ Set is first written and where it may be rewritten after error detection, is called latency. Latency is typically measured in CQ Sets. For example, if the latency is 4, and a written CQ Set N is found to have an error, it may be rewritten as CQ Set N+4. FIG. 12 illustrates an example of latency while writing a single Sub Data Set in CQ Sets 0 and 1. Because CQ 0 and CQ 1 cannot be read verified until the distance along tape equivalent to 5 CQ Sets, at least this number of CQ Sets must be allocated to writing the Sub Data Set even if the data content is smaller. If no error is detected, as illustrated in FIG. 12, the write operation terminates with the DSS pattern.

In order to maintain ECC capability, the present invention optionally fills the region on tape between the last written CQ Set and the location where CQ Sets may be rewritten in case of error by repeatedly writing the CQ Set or Sets. Previously written data is eliminated and additional instances of the CQ Set are recorded, thereby enhancing the probability that at least one instance of each Codeword Pair in the Sub Data Set will be successfully recovered on read.

Figure 13:
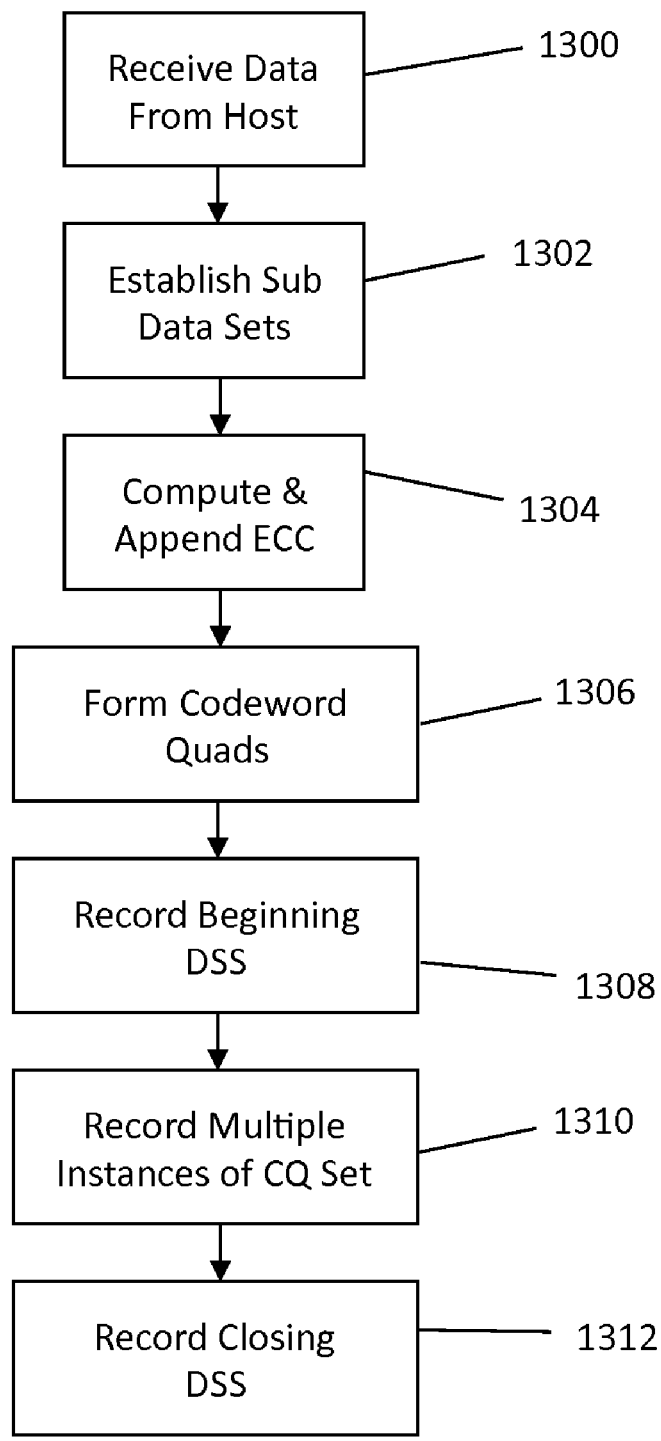
FIG. 13 is a flow chart of one embodiment of a method of write multiple copies of CQ sets to the tape in accordance with the present invention.

The flowchart of FIG. 13 illustrates a method of this aspect of the present invention. Data is received from the host 10 by the drive 300 (step 1300). Under the direction of the recording system logic 322, Sub Data Sets are established (step 1302) and C1 and C2 ECC symbols are computed and appended to the Sub Data Sets (step 1304). Codeword Quads are then formed (step 1306) and the write head 306 records a beginning DSS recorded to the tape 20 (step 1308). Instead of recording a single instance of the CQ Sets 0 and 1 to the tape 20 and allowing the latency to be wasted, multiple instances of the CQ Sets are recorded to the tape 20 (step 1310) thereby increasing the probability of recovering at least one instance of each Codeword Pair. Subsequently, a closing DSS is recorded to the tape 20 (step 1312).

Figure 14:
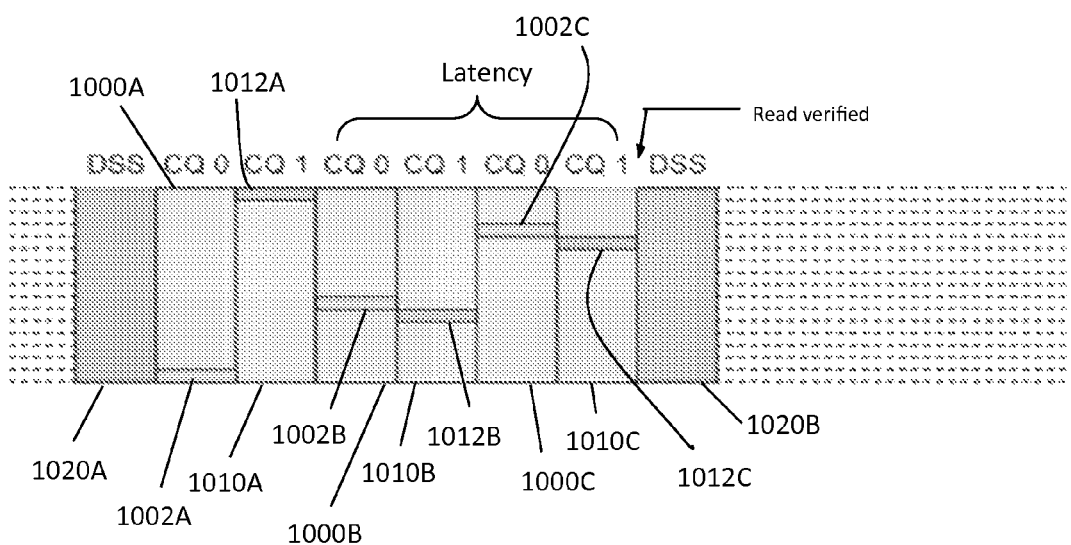
FIG. 14 is an embodiment of the present invention in which multiple CQ Sets are recorded during a write-to-read-verification latency in a system with latency of 5.

FIG. 14 illustrates one variation of the method of FIG. 13. The Sub Data Set is written in a system with latency of 5. CQ Sets 0 and 1 1000A, 1010A are the first instance of the Sub Data Set and follow the beginning DSS 1020. Due to the latency, CQ 0 cannot be read verified until the third instance of CQ 0 or CQ 1. In accordance with this aspect of the present invention, the CQ Set pairs are repeatedly written until the first CQ 0 and CQ 1 can be read verified; that is, until the latency of 5 has ended. In the illustrated system, two additional pairs of CQ 0 and CQ 1 1000B, 1010B are written. If the first instance of CQ 0 and CQ 1 100A, 1010A has no error, no additional CQ Sets for this Sub Data Set are written and the write operation terminates with the closing DSS pattern 1020B. Therefore a total of three instances of the Sub Data Set are written, only the first of which was read verified. Thus, a benefit of repeating the CQ Sets is that at least 3 instances of any one Codeword Pair exist, each separated longitudinally by at least the length of one CQ Set, thereby increasing the probability of recovering at least one instance of each Codeword Pair.

Figure 15:
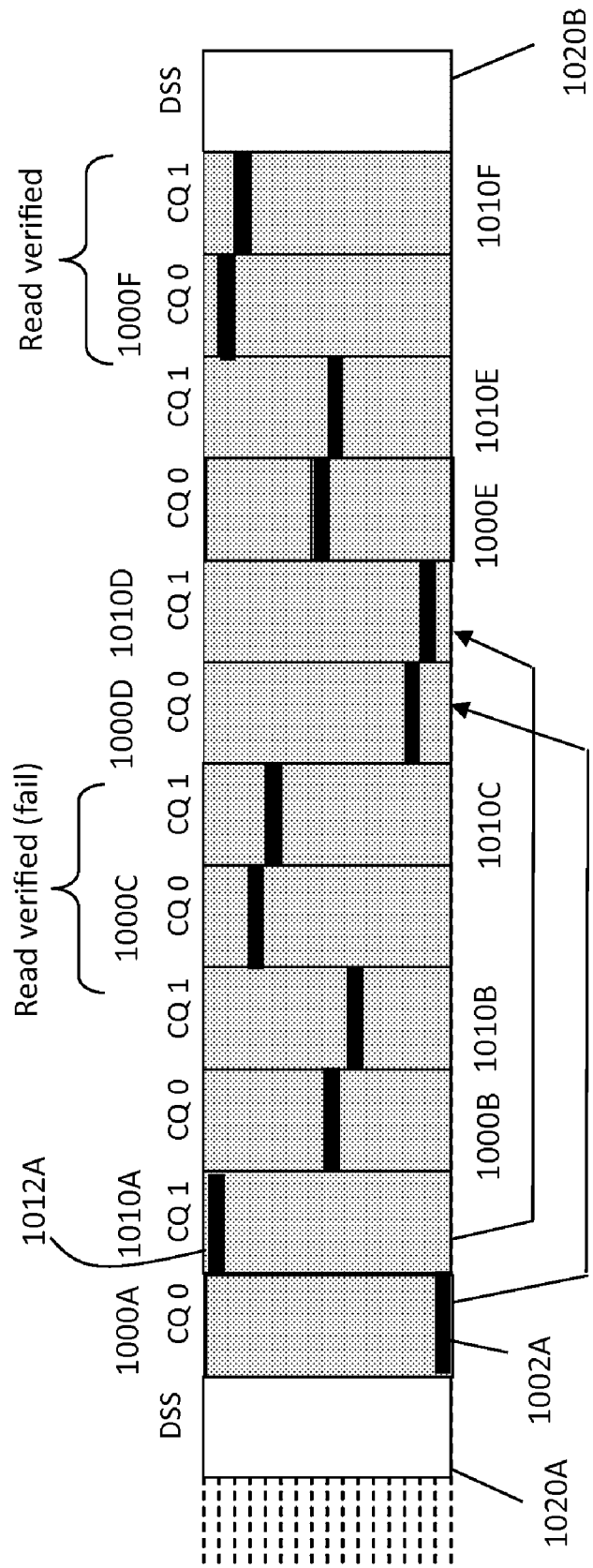
FIG. 15 illustrates writing multiple CQ Sets following the detection of an error in one of the originally written CQ Sets.

If, as illustrated in FIG. 15, an error was detected in either the first CQ 0 1000A or the first CQ1 1010A after a first attempt to read verify, both are rewritten 1000D, 1010D and followed again by the number of CQ Set repeats 1000E, 1000F and 1010E, 1010F (such as two in the illustrated example) to allow read verification of that rewritten pair. Therefore a total of six instances of the Sub Data Set are written, of which only the first and fourth were read verified, with the first verification having had one or more errors. Once the read verify operation is successful, the closing DSS 1020B is written.

Figure 16:
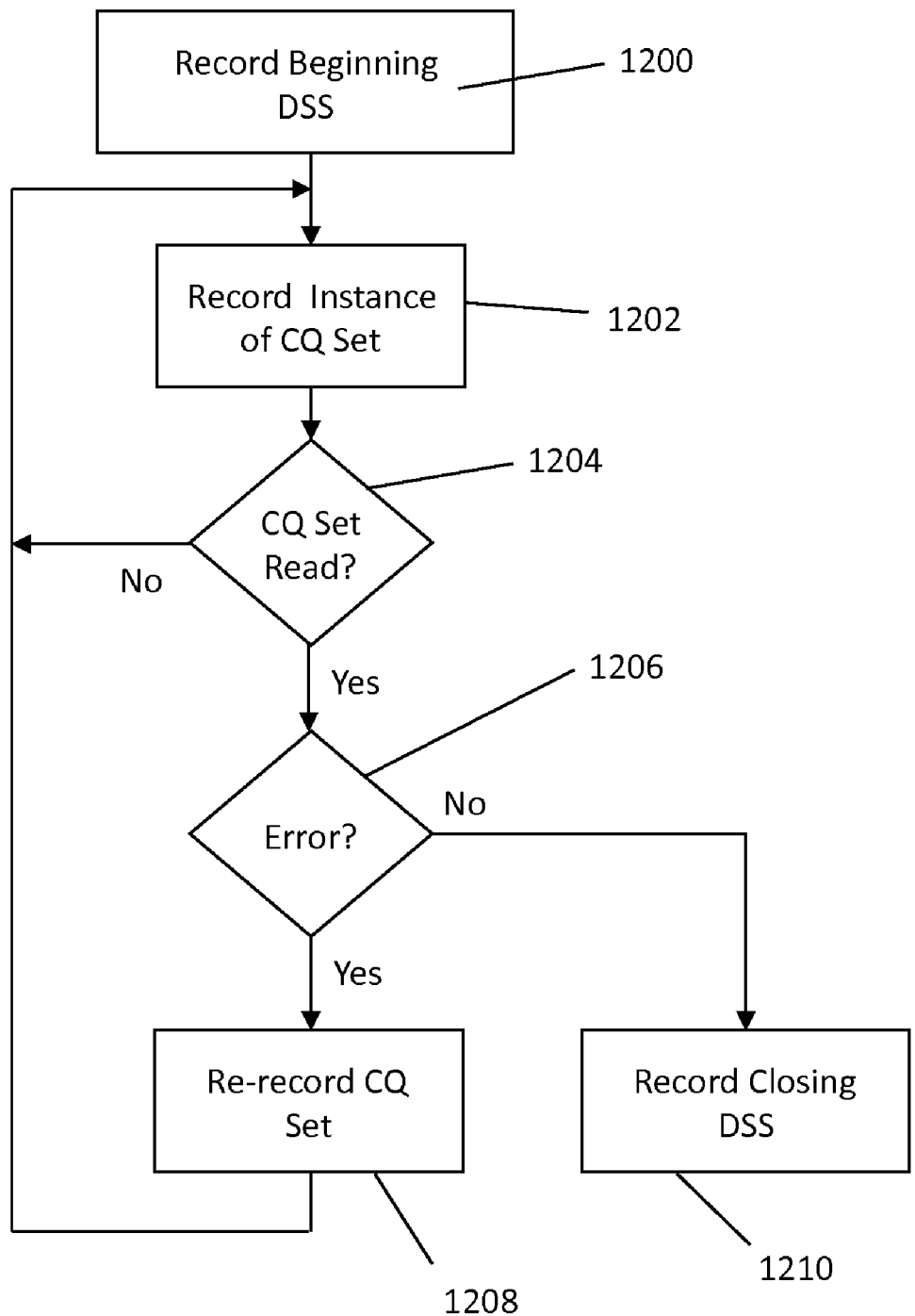
FIG. 16 is a flow chart of an embodiment of a method of the present invention in which multiple CQ Sets are written during the write-to-read-verification latency.

FIG. 16 is a flowchart of this aspect of the present invention. A beginning DSS is recorded to the tape 20 (step 1200) and a first instance of the CQ Set is then recorded (step 1202). A determination is made as to whether the CQ Set has been read for verification (step 1204). If not, another instance of the CQ Set is recorded (step 1202) and the process repeats until the first instance of the CQ Set is read-verified. If an error is detected (step 1206), the CQ Set is re-recorded (step 1208) and the process returns to record additional instances of the CQ Set (step 1202) until the re-recorded CQ Set is read-verified (step 1204). If an error is again detected (step 1206), the process repeats. When the CQ Set is read-verified with no error, the closing DSS is recorded (step 1210). Thus, multiple instances of the CQ Set are recorded during a previously wasted latency period.

Figure 17:
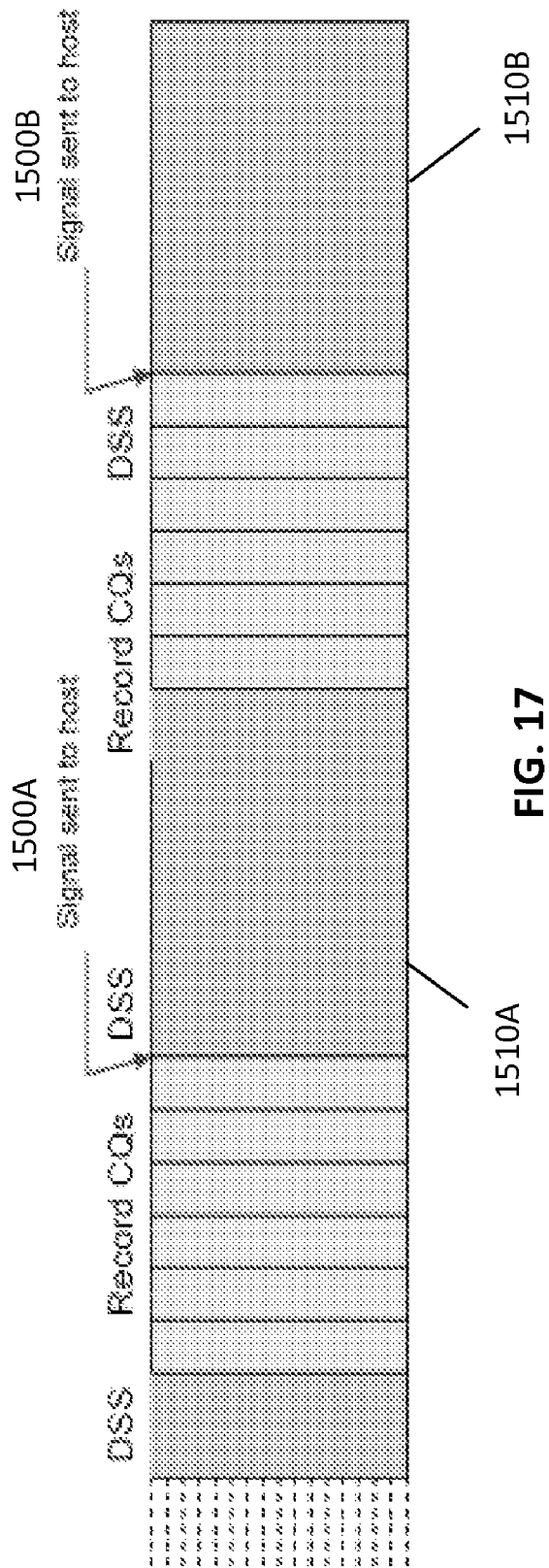
FIG. 17 illustrates a recording format in which an extended closing DSS is written after a Record Complete signal has been transmitted to the host until new data is received from the host.

As illustrated in FIG. 17, in the method of writing data of the present invention, when the drive completes writing of a record and the CQ Sets have been verified, it sends a signal 1500A, 1500B to the host to get another record. The drive may then stop or may continue writing multiple DSSs 1510A, 1510B until the host responds with the next record. Thus, the writing sequence of CQ Sets can be described as: (a) the host sends a record to the drive for recording; (b) a beginning DSS is written; (c) followed by the essential CQ Sets; (d) the drive continues writing an unspecified sequence until the two CQ Sets pass beneath the read head; (e) when both CQ Sets are verified, a terminating DSS begins; and (f) when the CQ Sets are assuredly committed to tape, the tape drive sends a 'Record Complete' signal to the host indicating successful writing, at which time the drive waits for the host to send another record for recording. This process repeats indefinitely along the tape.

It is important to note that while the present invention has been described in the context of a fully functioning data processing system, those of ordinary skill in the art will appreciate that the processes of the present invention are capable of being distributed in the form of a computer storage readable medium of instructions and a variety of forms and that the present invention applies regardless of the particular type of signal bearing media actually used to carry out the distribution. Examples of computer readable storage media include recordable-type media such as a floppy disk, a hard disk drive, a RAM, and CD-ROMs.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for writing data to magnetic tape or a method for deploying computing infrastructure comprising integrating computer readable code into a computing system for writing data to magnetic tape.

What is claimed is:

1. A method for writing data to magnetic tape, wherein the data comprises less than a full Data Set, the method comprising:
    receiving data from a host;
    issuing a do-not-interleave command;
    computing C1 and C2 ECC;
    forming Codeword Quad (CQ) sets;
    writing at least one CQ set of the Data Set to a magnetic tape in a non-interleaved manner; and
    writing a Data Set Information Table (DSIT) to the magnetic tape immediately following the at least one written CQ set.

2. The method of claim 1, further comprising executing an address transformation for the Sub Data Sets in response to the do-not-interleave command.

3. The method of claim 2, wherein executing the address transformation comprises transforming an address of R row of N Sub Data Set into an address of N row of R Sub Data Set.

4. The method of claim 1, wherein writing the at least one CQ set to the magnetic tape comprises writing a plurality of contiguous instances of the at least one CQ set to the magnetic tape.

5. The method of claim 4, wherein writing the plurality of contiguous instances of the at least one CQ set comprises:
    writing a first instance of the at least CQ set;
    determining if the first instance of the at least one CQ set has been read-verified;
    if the first instance of the at least one CQ set has not been read-verified:
        writing another instance of the at least one CQ set; and
        returning to the determining step; and
    if the first instance of the at least one CQ set has been read-verified:

ascertaining if an error has been detected in the first instance of the at least one CQ set;
if an error has been detected:
re-writing the at least one CQ set; and
returning to the determining step; and
if an error has not been detected, writing a closing DSS.

6. A recording system controller coupled to control an interface, a write head, a write channel, a read head, a read channel and at least one drive motor of a magnetic tape drive, the controller operable to:
establish Sub Data Sets from data received from a host;
issue a do-not-interleave command;
compute C1 and C2 ECC for the Sub Data Sets;
form Codeword Quad (CQ) sets;
write at least one CQ set of the Data Set to a magnetic tape in a non-interleaved manner; and
write a Data Set Information Table (DSIT) to the magnetic tape immediately following the at least one written CQ set.

7. The controller of claim 6, further operable to execute an address transformation for the Sub Data Sets in response to the do-not-interleave command.

8. The controller of claim 7, wherein the controller is operable to execute the address transformation by transforming an address of R row of N Sub Data Set into an address of N row of R Sub Data Set.

9. The system logic of claim 6, wherein the controller is operable to write the at least one CQ set to the magnetic tape by writing a plurality of contiguous instances of the at least one CQ set to the magnetic tape.

10. The system logic of claim 9, wherein the controller is operable to write the plurality of contiguous instances of the at least one CQ set by:
writing a first instance of the at least one CQ set;
determining if the first instance of the at least one CQ set has been read-verified;
if the first instance of the at least one CQ set has not been read-verified:
writing another instance of the at least one CQ set; and
returning to the determining step; and
if the first instance of the at least one CQ set has been read-verified:
ascertaining if an error has been detected in the first instance of the at least one CQ set;
if an error has been detected:
re-writing the at least one CQ set; and
returning to the determining step; and
writing a closing DSS if an error has not been detected.

11. A tape drive for writing data to magnetic tape, comprising:
an interface through which data and instructions are exchanged with a host;
a write head for recording data onto the magnetic tape;
a write channel for processing data to be recorded by the write head;
a read head for reading data from the magnetic tape;
a read channel for processing data read by the read head;
at least one drive motor for transporting the magnetic tape longitudinally past the read and write heads; and
a C1 encoder operable to compute C1 ECC for the Sub Data Sets;
a C2 encoder operable to compute C2 ECC for the Sub Data Sets;
a formatter operable to form Codeword Quad (CQ) sets; and
a controller coupled to control the interface, the write head, the write channel, the read head, the read channel and the at least one drive motor, the controller operable to:
establish Sub Data Sets from the data received from the host;
issue a do-not-interleave command;
direct that at least one CQ set of the Data Set be written to a magnetic tape in a non-interleaved manner; and
direct that a Data Set Information Table (DSIT) be written to the magnetic tape immediately following the at least one written CQ set.

12. The tape drive of claim 11, further comprising a DRAM buffer controller having address transformation logic operable to perform an address transformation for the Sub Data Sets in response to the do-not-interleave command.

13. The tape drive of claim 12, wherein the address transformation logic comprises logic for transforming an address of R row of N Sub Data Set into an address of N row of R Sub Data Set.

14. The tape drive of claim 11, wherein the controller is further operable to write a plurality of contiguous instances of the at least one CQ set to the magnetic tape.

15. The tape drive of claim 14, wherein the controller is further operable to:
write a first instance of the at least one CQ set;
determine if the first instance of the at least one CQ set has been read-verified;
if the first instance of the at least one CQ set has not been read-verified:
write another instance of the at least one CQ set; and
return to the determining step; and
if the first instance of the at least one CQ set has been read-verified:
ascertain if an error has been detected in the first instance of the at least one CQ set;
if an error has been detected:
re-write the at least one CQ set; and
return to the determining step; and
write a closing DSS if an error has not been detected.

16. A computer program product of a computer readable storage medium usable with a programmable controller, the computer program product having computer-readable program code embodied therein for writing data to magnetic tape, the computer program product comprising instructions for:
receiving data from a host;
issuing a do-not-interleave command;
computing C1 and C2 ECC;
forming Codeword Quad (CQ) sets;
writing at least one CQ set of the Data Set to a magnetic tape in a non-interleaved manner; and
writing a Data Set Information Table (DSIT) to the magnetic tape immediately following the at least one written CQ set.

17. The computer program product of claim 16, further comprising instructions for executing an address transformation for the Sub Data Sets in response to the do-not-interleave command.

18. The computer program product of claim 17, wherein the instructions for executing the address transformation comprise instructions for transforming an address of R row of N Sub Data Set into an address of N row of R Sub Data Set.

19. The computer program product of claim 16, wherein the instructions for writing the at least one CQ set to the magnetic tape comprise instructions for writing a plurality of contiguous instances of the at least one CQ set to the magnetic tape.

20. The computer program product of claim 19, wherein the instructions for writing the plurality of contiguous instances of the at least one CQ set comprise instructions for:
- writing a first instance of the at least CQ set;
- determining if the first instance of the at least one CQ set has been read-verified;
- if the first instance of the at least one CQ set has not been read-verified:
  - writing another instance of the at least one CQ set; and
  - returning to the determining step; and
- if the first instance of the at least one CQ set has been read-verified:
  - ascertaining if an error has been detected in the first instance of the at least one CQ set;
  - if an error has been detected:
    - re-writing the at least one CQ set; and
    - returning to the determining step; and
  - if an error has not been detected, writing a closing DSS.

21. A method for deploying computing infrastructure, comprising integrating computer readable code into a computing system, wherein the code, in combination with the computing system, is capable of performing the following:
- receiving data from a host;
- issuing a do-not-interleave command;
- computing C1 and C2 ECC;
- forming Codeword Quad (CQ) sets;
- writing at least one CQ set of the Data Set to a magnetic tape in a non-interleaved manner; and
- writing a Data Set Information Table (DSIT) to the magnetic tape immediately following the at least one written CQ set.

22. The method of claim 21, further comprising executing an address transformation for the Sub Data Sets in response to the do-not-interleave command.

23. The method of claim 22, wherein executing the address transformation comprises transforming an address of R row of N Sub Data Set into an address of N row of R Sub Data Set.

24. The method of claim 21, wherein writing the at least one CQ set to the magnetic tape comprises writing a plurality of contiguous instances of the at least one CQ set to the magnetic tape.

25. The method of claim 24, wherein writing the plurality of contiguous instances of the at least one CQ set comprises:
- writing a first instance of the at least CQ set;
- determining if the first instance of the at least one CQ set has been read-verified;
- if the first instance of the at least one CQ set has not been read-verified:
  - writing another instance of the at least one CQ set; and
  - returning to the determining step; and
- if the first instance of the at least one CQ set has been read-verified:
  - ascertaining if an error has been detected in the first instance of the at least one CQ set;
  - if an error has been detected:
    - re-writing the at least one CQ set; and
    - returning to the determining step; and
  - if an error has not been detected, writing a closing DSS.

* * * * *